(12) United States Patent
Hwang

(10) Patent No.: US 8,861,208 B2
(45) Date of Patent: Oct. 14, 2014

(54) PCB FIXING DEVICE AND FLAT PANEL DISPLAY INCLUDING THE SAME

(75) Inventor: Jung-Ho Hwang, Yongin (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 301 days.

(21) Appl. No.: 13/294,127

(22) Filed: Nov. 10, 2011

(65) Prior Publication Data
US 2012/0134123 A1 May 31, 2012

(30) Foreign Application Priority Data
Nov. 25, 2010 (KR) .................. 10-2010-0118336

(51) Int. Cl.
*H05K 5/00* (2006.01)
*H05K 7/14* (2006.01)

(52) U.S. Cl.
CPC .............. *H05K 7/1404* (2013.01); *H05K 7/142* (2013.01)
USPC ........... 361/752; 361/727; 361/801; 361/802; 361/810

(58) Field of Classification Search
CPC .......... H05K 5/00; H05K 7/14; H05K 7/1418
USPC .......................... 361/752, 727, 801, 802, 810
See application file for complete search history.

(56) References Cited

U.S. PATENT DOCUMENTS

| 5,019,948 | A * | 5/1991 | Steketee et al. ............... 361/802 |
| 7,916,499 | B2 * | 3/2011 | Feng et al. .................... 361/801 |
| 2008/0094810 | A1 * | 4/2008 | Lajara et al. .................. 361/759 |

FOREIGN PATENT DOCUMENTS

| KR | 10-1997-0078777 A | 12/1997 |
| KR | 10-2008-0087950 A | 10/2008 |

* cited by examiner

*Primary Examiner* — Xiaoliang Chen
(74) *Attorney, Agent, or Firm* — Knobbe Martens Olson & Bear LLP (57) ABSTRACT

A PCB fixing device includes a case having a plurality of sliding holes spaced apart from each other, and a plurality of fixing members engaged with and movable along the sliding holes, and configured to couple with edges of a PCB to fix the PCB to the case. Accordingly, the position of the PCB fixing device can be adjusted according to the size of the PCB by moving the fixing member along the sliding hole. The PCB fixing device is applicable to PCBs of various sizes and structures, and can reduce loss resulting from a change in the specification of a PCB.

13 Claims, 6 Drawing Sheets

PCB FIXING DEVICE AND FLAT PANEL DISPLAY INCLUDING THE SAME

RELATED APPLICATIONS

This application claims priority to and the benefit of Korean Patent Application No. 10-2010-0118336 filed in the Korean Intellectual Property Office on Nov. 25, 2010, the entire contents of which are incorporated herein by reference.

BACKGROUND

1. Field

The described technology relates generally to a printed circuit board fixing device and a flat panel display including the same.

2. Description of the Related Technology

In general, a flat panel display comprises a liquid crystal display panel, an organic light emitting display panel, etc. The flat panel display further includes a printed circuit board (PCB) having a drive element mounted therein for the driving and signal processing of a display panel, a terminal for connecting and supplying a signal, a power source, etc., and a case for mounting and protecting the display panel, the printed circuit board, the terminal, etc.

In general, the PCB is correctly situated and fixed on a predetermined position of the case. To this end, a PCB fixing structure is usually used. A hole is formed in the PCB, a PEM nut is attached to the case, and then a screw is put through the hole of the PCB to fasten the PCB to the PEM nut.

However, in the event of a dimensional error or positioning error between the PCB fixing device (the PEM nut and the screw) and the hole of the PCB due to a manufacturing error, it is difficult to assemble the PCB to the case.

Adjusting of such errors is time consuming and even very hard when PCBs have various sizes.

The above information disclosed in this Background section is only for enhancement of understanding of the background of the described technology and therefore it may contain information that does not form the prior art that is already known in this country to a person of ordinary skill in the art.

SUMMARY

An aspect of the invention provides a PCB fixing device, which minimizes a coupling error between the PCB fixing device and a PCB and is applicable to PCBs of various sizes, and a flat panel display including the same.

An embodiment provides a PCB fixing device including: a case having a plurality of sliding holes spaced apart from each other; and a plurality of fixing members engaged with and movable along the sliding holes, and coupling with edges of a PCB to fix the PCB to the case.

Each of the fixing members may include: a moving part moving along the sliding hole; a board coupling part installed on the moving part and coupled to an edge of the PCB; and a fastening part fastening the board coupling part and the moving part.

At least one sliding hole may be formed at a position corresponding to each of the edges of the PCB.

The plurality of sliding holes may include at least one left sliding hole, at least one right sliding hole, at least one upper sliding hole, and at least one lower sliding hole, each of which extends in a direction perpendicular to one of four edges of the PCB.

The plurality of fixing members may include at least one left fixing member, at least one right fixing member, at least one upper fixing member, and at least one lower fixing member that are located in the at least one left sliding hole, the at least one right sliding hole, the at least one upper sliding hole, and the at least one lower sliding hole, respectively.

One of the at least one left sliding hole, the at least one right sliding hole, the at least one upper sliding hole, and the at least one lower sliding hole may include two or more sliding holes, and one of the at least one left fixing member, the at least one right fixing member, the at least one upper fixing member, and the at least one lower fixing member may include two or more fixing members.

The PCB fixing device may further include an engaging portion formed adjacent to one of the sliding holes and over the bottom surface of the case.

The moving part may include: a lower moving part fastened to the engaging portion; and an upper moving part installed between the lower moving part and the board coupling part.

The position of the board coupling part may be adjusted as the moving part moves along the sliding hole.

The fastening part may have a bolt shape, and the board coupling part may have a coupling hole at a position corresponding to the fastening part, the upper moving part may have an upper moving hole at a position corresponding to the coupling hole, the lower moving part may have a nut portion at a position corresponding to the upper moving hole, and the fastening part may pass through the coupling hole and the upper moving hole and be fastened to the nut portion.

The board coupling part may have a coupling groove into which the edge of the circuit substrate is inserted.

An embodiment provides a flat panel display including: a flat display panel for displaying an image; a case having a plurality of sliding holes spaced apart from each other; a PCB attached to the case; and a PCB fixing device for fixing the PCB to the case.

The PCB fixing device may include a plurality of fixing members that move along the sliding holes, and engage with edges of the PCB to fix the PCB.

Each of the fixing members may include: a moving part moving along the sliding hole; a board coupling part installed on the moving part and coupled to an edge of the PCB; and a fastening part fastening the board coupling part and the moving part.

The board coupling part and the fastening part may be located on the opposite side of the flat display panel with respect to the lower case.

Each of The plurality of sliding holes may partly overlap with the PCB.

According to embodiments of the present invention, it is possible to determine the position of a fixing member in conformation with the size of the PCB and fix an edge of the PCB to the fixing member by moving the fixing member along the sliding hole. Accordingly, the PCB fixing device according to an embodiment is applicable to PCBs with various sizes and structures, and can reduce loss resulting from a change in the specification of a PCB.

Moreover, any coupling error generated between the PCB fixing device and the PCB can be easily corrected because all the fixing members are movable along the sliding holes.

In addition, even if there is a change in the positions of a jack, a connector, an EMI shielding, etc. in the PCB, the PCB can be correctly fixed in place by adjusting the positions of the fixing members.

DETAILED DESCRIPTION

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to clarify embodiments of the present invention, elements extrinsic to the description are omitted from the details of this description, and like reference numerals refer to like elements throughout the specification.

The size and thickness of each component shown in the drawings are arbitrarily shown for better understanding and ease of description, and thus the present invention is not limited to those shown in the drawings.

A PCB fixing device and a flat panel display including the same according to one embodiment will be described in detail with reference to FIGS. 1 to 6.

Figure 1:
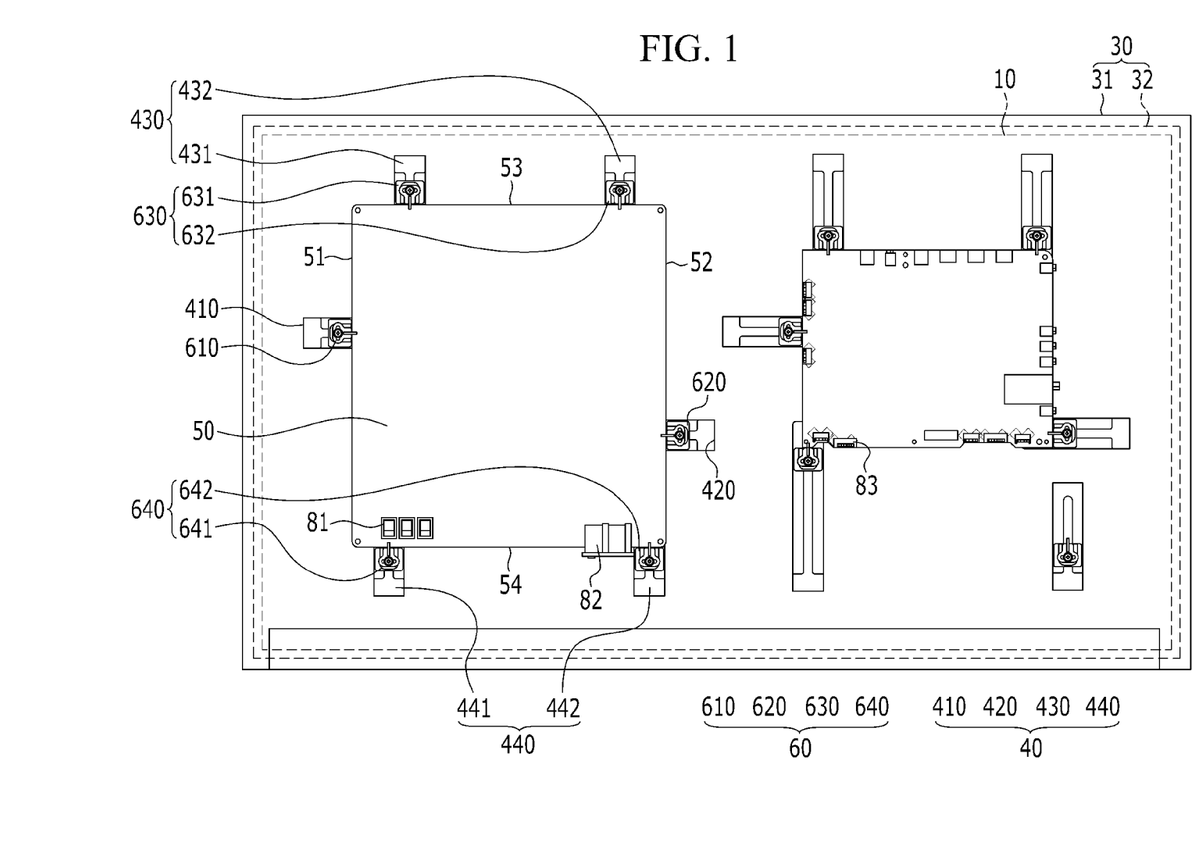
FIG. 1 is a plan view of a PCB fixing device and a flat panel display including the same according to one embodiment.
Figure 2:
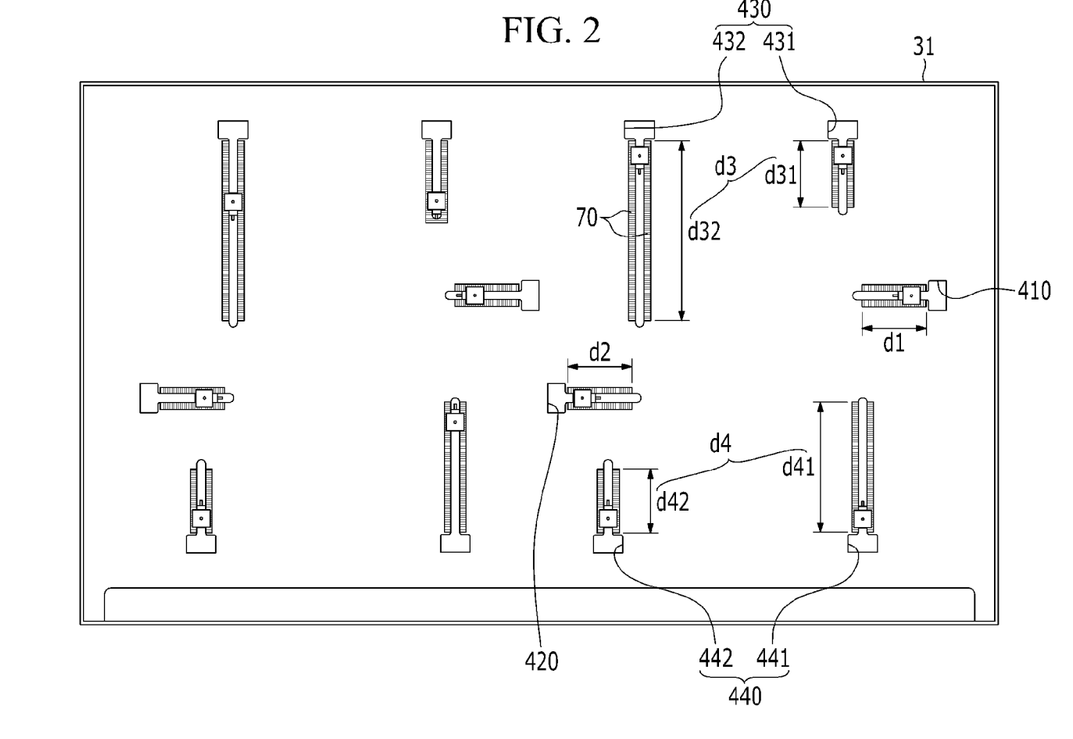
FIG. 2 is a rear view of the PCB fixing device according to one embodiment.

FIG. 1 is a plan view of a PCB fixing device and a flat panel display including the same according to one embodiment. FIG. 2 is a rear view of the PCB fixing device according to one embodiment.

As shown in FIGS. 1 and 2, the flat panel display according to one embodiment comprises a flat display panel 10 for displaying an image, a case 30 covering the flat display panel 10, a PCB 50 attached to the case 30, and PCB fixing devices 60 for fixing the PCB 50 to the case 30.

The flat display panel may be a liquid crystal display panel, an organic light emitting display panel, etc. The case 30 is provided for protecting the flat display panel 10 from external impact and includes a lower case 31 and an upper case 32. The lower case 31 has a plurality of sliding holes 40 spaced apart from each other. The PCB 50 may be a drive device, a switching mode power supply (SMPS), a signal controller (timing controller), or the like, and the PCB 50 is attached to the top surface of the lower case.

The plurality of sliding holes 40 formed in the lower case 31 include at least one left sliding hole 410, at least one right sliding hole 420, at least one upper sliding hole 430, and a lower sliding hole 440, which extend in four directions, respectively. The left sliding hole 410 extends in a direction perpendicular to a left edge 51 of the PCB 50, the right sliding hole 420 extends in a direction perpendicular to a right edge 52 of the PCB 50, the upper sliding hole 430 extends in a direction perpendicular to an upper edge 53 of the PCB 50, and the lower sliding hole 440 extends in a direction perpendicular to a lower edge 54 of the PCB 50. The length d1 of the left sliding hole 410, the length d2 of the right sliding hole 420, the length d3 of the upper sliding hole, and the length d4 of the lower sliding hole 440 may be different from each other.

The at least one left sliding hole 410 has one or more sliding holes. In one embodiment, the at least one left sliding hole 410 only includes a first left sliding hole 410. The at least one right sliding hole 420 has one or more sliding holes. In one embodiment, the at least one right sliding hole 420 only includes a first right sliding hole 420. The left sliding hole 410 and the right sliding hole 420 are disposed alternately with each other, and the length d1 of the left sliding hole 410 and the length d2 of the right sliding hole 420 may be different from each other.

The at least one upper sliding hole 430 has one or more sliding holes. In one embodiment, the at least one upper sliding hole 430 includes a first upper sliding hole 431 and a second upper sliding hole 432 spaced at a predetermined distance from the first upper sliding hole 431. The length d31 of the first upper sliding hole 431 and the length d32 of the second upper sliding hole 432 may be different from each other.

In the same way, the at least one lower sliding hole 440 has one or more sliding holes. In one embodiment, the at least one lower sliding hole 440 includes a first lower sliding hole 441 and a second lower sliding hole 442 spaced at a predetermined distance from the first lower sliding hole 441. The length d41 of the first lower sliding hole 441 and the length d42 of the second lower sliding hole 424 may be different from each other.

A pair of engaging portions 70 is formed at a portion of the case adjacent to each of the sliding holes 410, 420, 430, and 440 and over the bottom surface of the case 30. The engaging portions 70 have a structure in which a convexo-concave pattern or undulating pattern is repeated. In one embodiment, two engaging portions 70 are installed at both sides of and adjacent to each of the sliding holes 410, 420, 430, and 440.

The PCB fixing device 60 comprises a plurality of fixing members 610, 620, 630, and 640 which are movable along the plurality of sliding holes 410, 420, 430, and 440, and the positions of the fixing members can be adjusted. The plurality of fixing members 610, 620, 630, and 640 are engaged with the four edges 51, 52, 53, and 54 of the PCB 50 and fix the PCB 50 to the case.

The plurality of fixing members 610, 620, 630, and 640 comprise at least one left fixing member 610 located in the at least one left sliding hole 410, at least one right fixing member 620 located in the at least one right sliding hole 420, at least one upper fixing member 630 located in the at least one upper sliding hole 430, and at least one lower fixing member 640 located in the at least one lower sliding hole 440.

The at least one left fixing member 610 has one or more fixing members. In one embodiment, the at least one left fixing member 610 includes only a first left fixing member 610. The at least one right fixing member 620 has one or more fixing members. In one embodiment, the at least one right fixing member 620 includes only a first right fixing member 620.

The at least one upper fixing member 630 has one or more fixing members. In one embodiment, the at least one upper fixing member 630 includes a first upper fixing member 631 and a second upper fixing member 632 spaced at a predetermined distance from the first upper fixing member 631.

In the same way, the at least one lower fixing member 640 has one or more fixing members. In one embodiment, the at least one lower fixing member 640 includes a first lower fixing member 641 and a second lower fixing member 642 spaced at a predetermined distance from the first lower fixing member 641.

Specifically, the structure of the left fixing member 610 will be described below in detail with reference to FIGS. 3 to 6. In embodiments, the structures of the left fixing member 620, the upper fixing member 630, and lower fixing member 640 are for the most part identical to the structure of the left fixing member 610, but the invention is not limited thereto.

Figure 3:
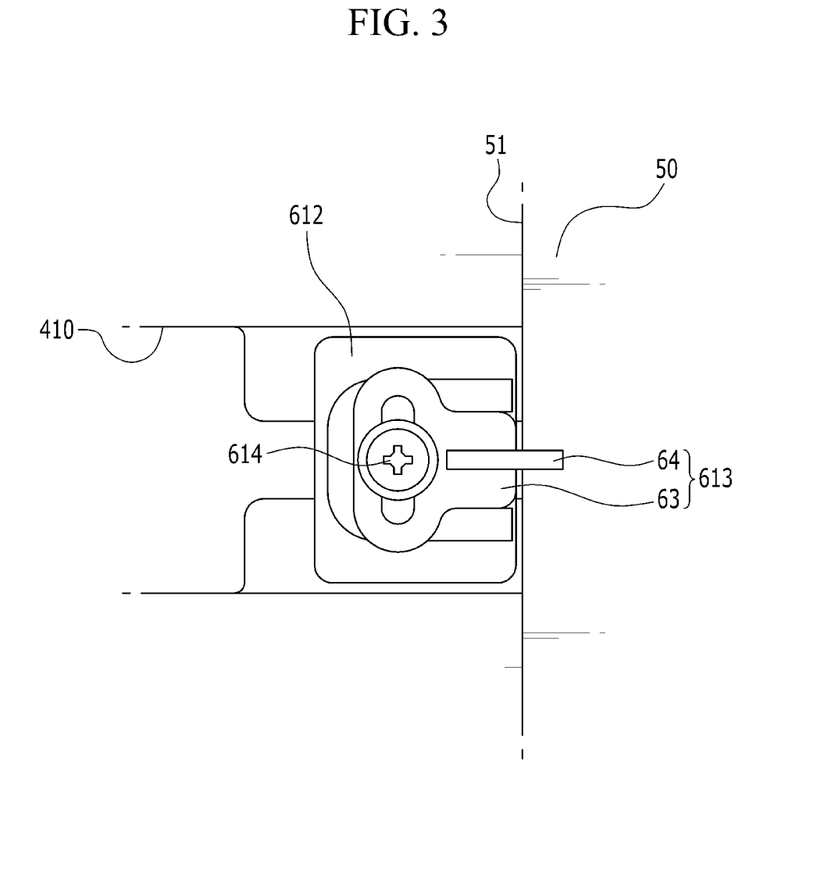
FIG. 3 is a plan view of a left fixing member of the PCB fixing device according to one embodiment.
Figure 4:
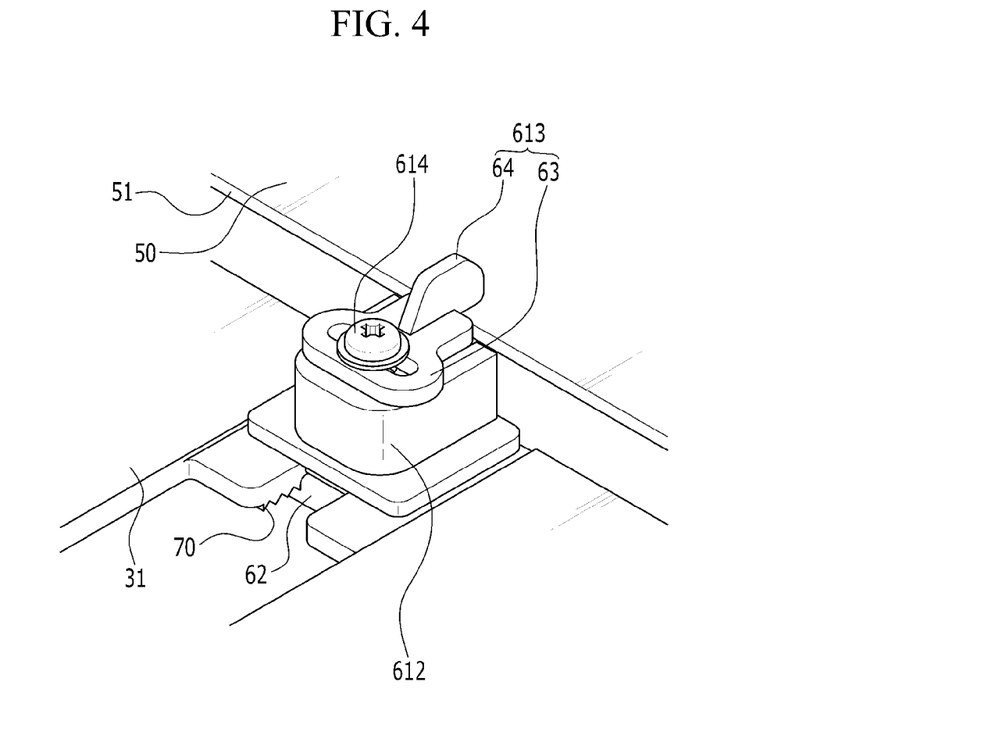
FIG. 4 is a perspective view of the left fixing member of the PCB fixing device according to one embodiment.
Figure 5:
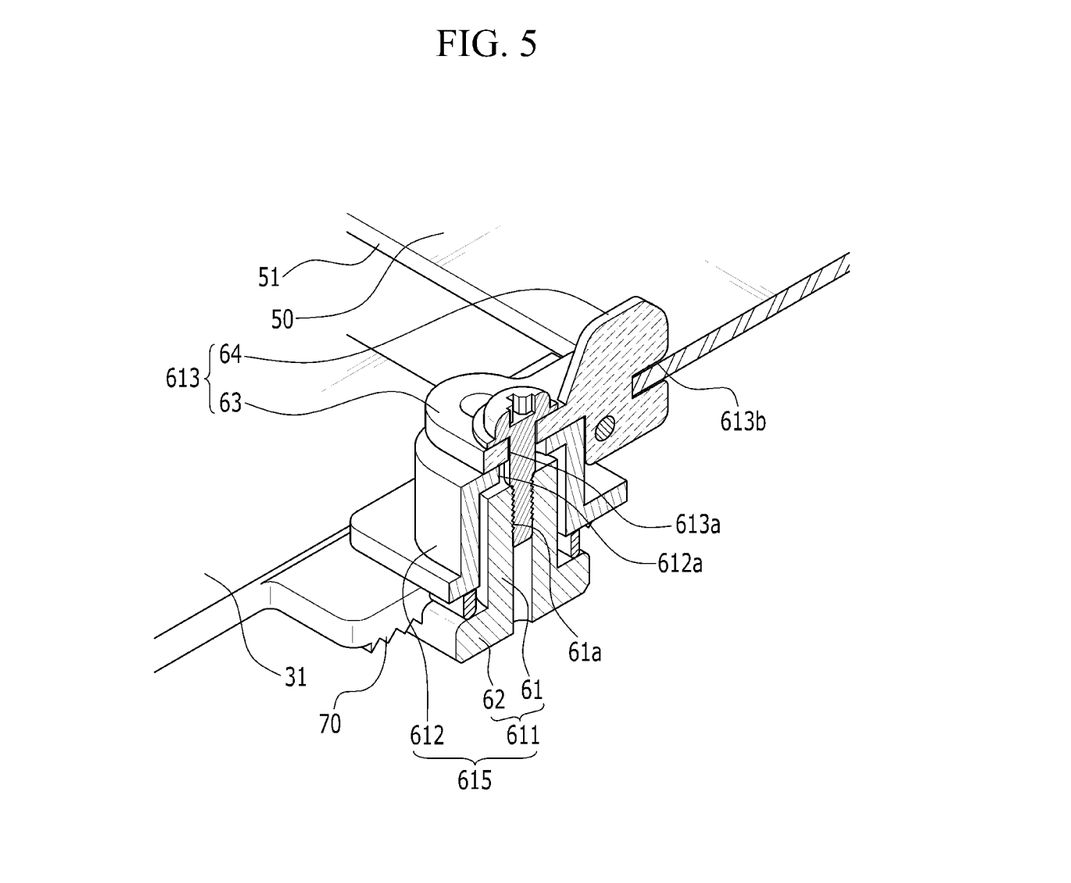
FIG. 5 is a cut-away perspective view of the left fixing member of the PCB fixing device according to one embodiment.
Figure 6:
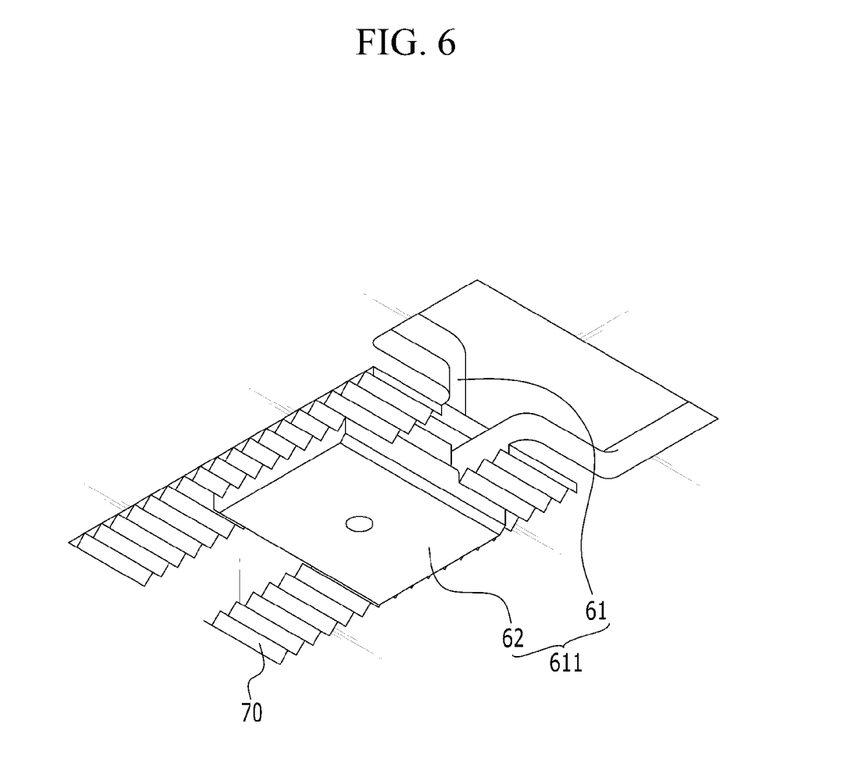
FIG. 6 is a rear perspective view of the left fixing member of the PCB fixing device according to one embodiment.

FIG. 3 is a plan view of a left fixing member of the PCB fixing device according to one embodiment. FIG. 4 is a perspective view of a left fixing member of the PCB fixing device according to one embodiment. FIG. 5 is a cut-away perspective view of the left fixing member of the PCB fixing device according to one embodiment. FIG. 6 is a rear perspective view of the left fixing member of the PCB fixing device according to one embodiment.

The left fixing member 610 includes a moving part 615 movable along the left sliding hole 410, a board coupling part 613 installed on the moving part 615 and coupled to the left edge 51 of the PCB 50, and a fastening part 614 fastening the board coupling part 613 and the moving part 615.

The moving part 615 includes a lower moving part 611 fastened to a pair of engaging portions 70 and an upper moving part 612 is coupled to the lower moving part 611 and disposed between the lower moving part 611 and the board coupling part 613. The lower moving part 611 includes a cylinder portion 61 having a nut portion 61a formed therein and a horizontal extending portion 62 horizontally extending from the bottom of the cylinder portion 61. Because a convexo-concave pattern is formed on the surface of the horizontal extending portion 62, the horizontal extending portion 62 is fastened to the pair of engaging portions 70 having a convexo-concave pattern. The lower moving part 611 moves along the sliding hole 410. In one embodiment, the lower moving part 611 can be moved sequentially by a predetermined distance by the pair of engaging portions 70, but not limited thereto.

The upper moving part 612 covers the cylinder portion 61 of the lower moving part 611, and is located on the upper surface of the case, i.e., the opposite side of the flat display panel 10 with respect to the case. The fastening part 614 passes through the upper moving part 612 because the upper moving part 612 has an upper moving hole 612a provided at a position corresponding to the nut portion 61a of the lower moving part 611.

The board coupling part 613 includes a horizontal portion 63 located on the upper moving part 612 and being in contact with the upper moving part 612 and a coupling groove portion 64 extending from the horizontal portion 63 and having a coupling groove or recess 613b. The fastening part 614 passes through the horizontal portion 63 because a coupling hole 613a is formed at a position corresponding to the upper moving hole 612a. The left edge 51 of the PCB 50 is inserted into the coupling groove 613b of the board coupling part 613, and hence the left edge 51 of the PCB 50 is supported.

The fastening part 614 has a bolt shape, passes through the coupling groove 613a of the board coupling portion 613 and the upper moving hole 612a of the upper moving part 612, and is fastened to the nut portion 61a of the lower moving part 611. By tightening the fastening part 614 of the left fixing member 610, the fastening part 614 of the left fixing member 610 is fastened to the nut portion 61a of the lower moving portion 611, and therefore the position of the left fixing member 610 is fixed.

As discussed above, the left fixing member 610 can be moved along the left sliding hole 410 to determine the fixed position of the left fixing member 610 according to the size of the PCB 50 and fix the left edge 51 of the PCB 50 to the left fixing member 610. The same is applicable to the right fixing member 620, the upper fixing member 630, and the lower fixing member 640. Accordingly, the PCB fixing device 60 according to one embodiment is applicable to PCBs 50 of various sizes and structures.

Moreover, any coupling error generated between the PCB fixing device 60 and the PCB 50 can be easily corrected because all of the left fixing member 610, the right fixing member 620, the upper fixing member 630, and the lower fixing member 640 are movable along the sliding holes 410, 420, 430, and 440.

In addition, even if there is a change in the positions of a jack 81, a connector 82, an EMI shield 83, etc. of the PCB 50, the PCB 50 can be fixed by adjusting the positions of the fixing members 610, 620, 630, and 640.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 10: flat display panel | 30: case |
| 40: sliding hole | 50: circuit board |
| 60: PCB fixing device | 70: engaging portion |
| 611: lower moving part | 612: upper moving part |
| 613: board coupling part | 614: fastening part |

What is claimed is:

1. A printed circuit board (PCB) fixing device for comprising:
    a case comprising a plurality of sliding holes spaced apart from each other;
    a plurality of fixing members engaged with and movable along the sliding holes, and configured to couple with edges of a PCB to fix the PCB to the case; and
    an engaging portion formed adjacent to one of the sliding holes and over a bottom surface of the case and comprising serrations,
    wherein each of the fixing members comprises:
        a moving part configured to move along the corresponding sliding hole;
        a board coupling part installed on the moving part and coupled to one of the edges of the PCB; and
        a fastening part configured to fasten the board coupling part and the moving part,
    wherein the position of the board coupling part is configured to be adjusted as the moving part moves along the corresponding sliding hole.

2. The PCB fixing device of claim 1, wherein at least one of the plurality of sliding holes is formed at a position corresponding to each of the edges of the PCB.

3. The PCB fixing device of claim 1, wherein the moving part comprises:
    a lower moving part configured to engage with the engaging portion; and
    an upper moving part disposed between the lower moving part and the board coupling part.

4. The PCB fixing device of claim 1, wherein the fastening part has a bolt shape.

5. The PCB fixing device of claim 1, wherein the board coupling part comprises a coupling groove into which the edge of the PCB is inserted.

6. A flat panel display comprising:
    a flat display panel configured to display an image;
    a PCB; and
    the PCB fixing device of claim 1, configured to fix the PCB.

7. The flat panel display of claim 6, wherein the board coupling part and the fastening part are located opposite to the flat display panel with respect to the case.

8. The flat panel display of claim 7, wherein the plurality of sliding holes partly overlaps with the PCB.

9. The PCB fixing device of claim 1, wherein the board coupling part comprising a notch which is recessed such that an edge of the PCB is inserted in the notch along a direction perpendicular to the edge as the moving part moves along the corresponding sliding hole.

10. A printed circuit board (PCB) fixing device for comprising:
- a case comprising a plurality of sliding holes spaced apart from each other; and
- a plurality of fixing members, each of which is engaged with and movable along one of the plurality of sliding holes, and configured to couple with an edge of a PCB to fix the PCB to the case,
- wherein the plurality of sliding holes comprise at least one left sliding hole, at least one right sliding hole, at least one upper sliding hole, and at least one lower sliding hole, each of which extends in a direction perpendicular to one of the four edges of the PCB.

11. The PCB fixing device of claim 10, wherein the plurality of fixing members comprises at least one left fixing member, at least one right fixing member, at least one upper fixing member, and at least one lower fixing member that are located in the at least one left sliding hole, the at least one right sliding hole, the at least one upper sliding hole, and the at least one lower sliding hole, respectively.

12. The PCB fixing device of claim 11, wherein one of the at least one left sliding hole, the at least one right sliding hole, the at least one upper sliding hole, and at least one the lower sliding hole comprises two or more sliding holes, and wherein one of the at least one left fixing member, the at least one right fixing member, the at least one upper fixing member, and the at least one lower fixing member comprises two or more fixing members.

13. A printed circuit board (PCB) fixing device comprising:
- a case comprising a plurality of sliding holes spaced apart from each other;
- a plurality of fixing members engaged with and movable along the sliding holes, and configured to couple with edges of a PCB to fix the PCB to the case; and
- an engaging portion formed adjacent to one of the sliding holes and over a bottom surface of the case,
- wherein each of the fixing members comprises:
  - a moving part configured to move along the sliding hole;
  - a board coupling part installed on the moving part and coupled to one of the edges of the PCB; and
  - a fastening part configured to fasten the board coupling part and the moving part,
- wherein the moving part comprises:
  - a lower moving part configured to engage with the engaging portion; and
  - an upper moving part disposed between the lower moving part and the board coupling part,
- wherein the board coupling part comprises a coupling hole at a position corresponding to the fastening part,
- wherein the upper moving part comprises an upper moving hole at a position corresponding to the coupling hole,
- wherein the lower moving part comprises a nut portion at a position corresponding to the upper moving hole,
- wherein the fastening part is configured to pass through the coupling hole and the upper moving hole and further configured to engage with the nut portion.

* * * * *